(12) United States Patent
Takahashi

(10) Patent No.: US 6,344,303 B1
(45) Date of Patent: Feb. 5, 2002

(54) IMAGE FORMING MATERIAL AND PREPARATION METHOD THEREOF

(75) Inventor: Hideki Takahashi, Hino (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 09/458,042

(22) Filed: Dec. 10, 1999

(30) Foreign Application Priority Data

Dec. 14, 1998 (JP) .............................. 10-354443

(51) Int. Cl.[7] .............................. G03F 7/16; G03F 7/34; G03F 7/36
(52) U.S. Cl. ........................ 430/253; 430/937; 430/322; 430/271.1; 430/258
(58) Field of Search ................................. 430/253, 937, 430/222, 271.1, 258

(56) References Cited

U.S. PATENT DOCUMENTS

| | | | |
|---|---|---|---|
| 5,691,103 A | * 11/1997 | Takeyama et al. | 430/200 |
| 5,693,447 A | * 12/1997 | Takeyama et al. | 430/201 |
| 5,939,231 A | * 8/1999 | Kawamura et al. | 430/201 |
| 6,030,712 A | * 2/2000 | Notsu et al. | 428/480 |

* cited by examiner

*Primary Examiner*—Cynthia Hamilton
(74) *Attorney, Agent, or Firm*—Finnegan, Henderson, Farabow, Garrett & Dunner, L.L.P

(57) ABSTRACT

A preparation method of an image forming material comprising a support having thereon at least an image forming layer is desclosed, comprising subjecting one side of the support to a treatment to modify the surface of the support and coating an image forming layer on the surface-modified support, wherein the image forming layer contains a resin containing a polar group and an compound containing an isocyanate group and the modified surface of the support exhibiting a surface energy of 45 to 60 dyne/cm, and wherein the image forming material is imagewise exposed to a high density energy light, thereby making an exposed area of the image forming layer removable and removing the removable image forming layer to form an image.

10 Claims, No Drawings

IMAGE FORMING MATERIAL AND PREPARATION METHOD THEREOF

FIELD OF THE INVENTION

The present invention relates to ablation type image forming materials with high resolution and superior image durability, and to a preparation method thereof.

BACKGROUND OF THE INVENTION

Recording methods have been known, in which light energy such as laser light is condensed and irradiated onto a recording element which is deformed by fusing or removed by scattering, burning or evaporating a part of the element (hereinafter, ablation is the general term for these processes). Such methods have the advantage in that they can be performed by dry processing using no processing solution containing chemicals, and a high contrast image can be obtained since only the irradiated part of the element is deformed by fusing or removed by scattering, burning or evaporating. Accordingly, the methods are applied to an optical recording element such as a photoresist element or a photodisk, and a transparent original for preparation of a printing plate.

For example, image forming materials using ferromagnetic powder as a colorant are proposed in Japanese Patent Publication Open to Public Inspection (hereinafter referred to as JP-A) Nos. 8-310124, 8-334894, 8-337053, 8-337054, 8-337055, 9-15849, etc. Employing these image forming materials, an image resulting in less stain and high resolution can be obtained.

However, in cases where the above-mentioned image forming materials are employed, there is occasionally a problem in image durability. In order to solve such problem, for example, image forming materials having a protective layer coated on an image forming layer are proposed in JP-A Nos. 60-255491, 61-061895, 61-199990, 61-206691, 62-234991, 10-151860, etc.

Employing these materials, the image durability is markedly increased, but in cases where these materials are used as a transparent original for preparation of a printing plate, etc., abrasion occasionally occurs and resistance to film cleaner used in a silver halide photographic film occasionally degrades.

SUMMARY OF THE INVENTION

Accordingly, it is an object to provide an ablation type image forming material exhibiting high resolution and little staining in exposed areas, superior film cleaner resistance and abrasion resistance, and giving formed images with little pin hole and superior durability; and a preparation method thereof.

The above object of the invention can be accomplished by the following constitution:

1. a method for preparing an image forming material comprising a support and at least an image forming layer, the method comprising the steps of:
   (i) subjecting at least one side of the support to a treatment to modify the surface of the support and
   (ii) forming the image forming layer on the surface-modified support by coating,
       wherein the image forming layer contains a resin containing a polar group and a compound containing an isocyanate group, and the modified surface of the support exhibits a surface energy of 45 to 60 dyne/cm;
   and wherein the image forming material is imagewise exposed to light, thereby at least a part of an exposed area of the image forming layer being made removable and the removable image forming layer being removed to form an image;
2. the method described in 1 above, wherein the treatment to modify the surface of the support is selected from the group consisting of a sand impingement treatment, a chemical-etching treatment, a flame treatment, an ozone treatment, a glow discharge treatment, a corona discharge treatment, a vacuum ultraviolet irradiation treatment, an electron beam irradiation treatment, a radiation ray irradiation treatment, an ultraviolet ray hardening treatment, a radiation graft polymerization treatment, a plasma polymerization treatment, a plasma graft polymerization treatment, a plasma discharge treatment, a photopolymerization treatment and an anchor coating treatment;
3. the method described in 2 above, wherein the treatment to modify the surface of the support is a corona discharge treatment;
4. the method described in 3 above, wherein the corona discharge treatment is performed at an intensity of 2 to 40 $W/m^2/min$;
5. the method described in 4 above, wherein the corona discharge treatment is performed at an intensity of 5 to 30 $W/m^2/min$;
6. the method described in 1 above, wherein the method further comprises
   forming a protective layer on the image forming layer by coating after or simultaneously with formation of the image forming layer;
   the method described in 1 above, wherein the image forming layer is an outermost layer;
8. the method described in 1 above, wherein the resin containing a polar group is a resin containing at least one selected from the group consisting of a hydroxy group, a carboxylic acid group and a sulfonic acid group;
9. the method described in 1 above, wherein the image forming material is further subjected to a thermosetting treatment after forming the image forming layer or after forming the protective layer;
10. the method described in 1 above, wherein the image forming layer exhibits a scratch hardness of 40 to 100 g, when subjected to a scratch test by the use of a 0.05 mm diameter sapphire needle;
11. the method described in 6 above, wherein the protective layer exhibits a scratch hardness of 40 to 100 g, when subjected to a scratch test by the use of a 0.05 mm diameter sapphire needle;
12. the method described in 1 above, wherein the method further comprises:
    subjecting the support to a dust removing treatment after step (i) and before step (ii);
13. the method described in 12 above, wherein said dust removing treatment is performed by applying at least one of suction, adhesive-roll and wiping;
14. the method described in 1 above, wherein a bond between the image forming layer and the support is weakened upon exposure, making at least a part of an exposed area of the image forming layer removable;
15. the method described in 14 above, wherein the image forming material further has a peeling layer, the peeling layer being peeled after exposure to remove at least a part of an exposed area of the image forming layer;

16. the method described in 1 above, wherein the support is a transparent support;

17. an image forming material comprising a support and an image forming layer, wherein at least a part of an exposed area of the image forming layer is removable, the image forming layer comprising a resin containing a polar group and a compound containing an isocyanate group; and the surface of at least one side of the support exhibiting a surface energy of 45 to 60 dyne/cm;

18. the image forming material described in 17 above, wherein the resin containing a polar group is a resin containing at least one of a hydroxy group, carboxylic acid group and sulfonic acid group;

19. the image forming material described in 17 above, wherein an outermost layer of the image forming material exhibits a scratch hardness of 70 to 100 g, when subjected to a scratch test by the use of a 0.05 mm diameter sapphire needle;

20. the image forming material described in 17 above, wherein the image forming material is exposed to light to weaken a bond between the image forming layer and the support, making at least a part of an exposed area of the image forming layer removable;

21. the image forming material described in 20 above, wherein the image forming material further has a peeling layer, the peeling layer being peeled after exposure to remove at least a part of an exposed area of the image forming layer;

22. an ablative image forming material comprising a transparent support having thereon an image forming layer and a protective layer, wherein one side of the support has been subjected to a corona discharge treatment to modify the surface of the support and the image forming layer is provided on the corona discharge-treated side of the support, the image forming layer containing a resin containing a polar group and an isocyanate group containing resin;

23. an ablative image forming material comprising a transparent support having thereon an image forming layer and a protective layer, wherein the image forming layer exhibits a surface hardness of 40 to 100 g in terms of a vertically loaded weight and the protective layer exhibits a surface hardness of 40 to 100 g in terms of a vertically loaded weight when subjected to a scratch test by the use of a 0.05 mm diameter sapphire needle; and 24. a method for preparing an ablative image forming material comprising a transparent support having thereon an image forming layer and a protective layer, wherein one side of the support is subjected to a corona discharge treatment at an intensity of 5 to 30 W/m$^2$/min to modify the surface of the support, then, the support is further subjected to a dust removing treatment by a method selected from suction, adhesive-roll and wiping methods and the image forming layer and the protective layer are coated on the corona discharge-treated side of the support and dried.

DETAILED DESCRIPTION OF THE INVENTION

The image forming material according to the present invention comprises a support having thereon an image forming layer; when the image forming material is exposed to light, at least a part of the exposed area of the image forming layer is made removable and the removable image forming layer is removed to form an image; the surface of at least one side of the support exhibits a surface energy of 45 to 60 dyne/cm and the image forming layer containing a resin containing a polar group and an isocyanate group containing resin. The image forming material is preferably provided with a protective layer, however, the protective layer need not be provided and the image forming layer may be the outermost layer. In cases where a peeling layer is provided, as described later, the peeling layer may be provided on the protective layer or on the image forming layer.

It is preferred that the image forming material be imagewise exposed to high density energy light, thereby making at least a part of the image forming layer removable and an image be formed by removing the removable image forming layer. In one embodiment of the invention, for example, the image forming material is exposed to light with high-density energy from the image forming layer side to fracture the exposed area of the image forming layer to a powdery dust form and subsequently, the fractured portion of the image forming layer is removed by suction or scratching. In the preferred embodiment of the invention, the image forming material is exposed to high density energy light to reduce a bonding strength between the image forming layer and the support, making removable at least a part of the exposed area of the image forming layer. In this case, the image forming material may have been provided with a peeling layer in advance, in which after exposure, the peeling layer is peeled to remove the exposed image forming layer. Alternatively, after exposure, a peeling sheet is laminated with the image forming material and then the peeling layer is peeled away to remove the exposed image forming layer.

The image forming layer contains a resin containing a polar group (or a polar group containing binder) and an isocyanate group containing a compound, and preferably further contains a colorant.

The support used in the invention, at least one side thereof exhibits a surface energy of 45 to 60 dyne/cm. According to the constitution of the invention, images with high density and high resolution can be obtained. Examples of the method for modifying the support surface so that a surface energy of the support is within such a range, include a sand impingement treatment, a chemical-etching treatment, a flame treatment, an ozone treatment, a glow discharge treatment, a corona discharge treatment, a vacuum ultraviolet irradiation treatment, an electron beam irradiation treatment, a radiation ray irradiation treatment, an ultraviolet ray hardening treatment, radiation graft polymerization treatment, a plasma polymerization treatment, a plasma graft polymerization treatment, a plasma discharge treatment, a photopolymerization treatment and an anchor coating treatment. Specifically, in cases of a ultraviolet ray hardening treatment, radiation craft polymerization treatment, a plasma polymerization treatment, plasma graft polymerization, a photopolymerization treatment and an anchor coating treatment, a layer is to be provided on the support surface, which preferably has a layer thickness of not more than 0.1 $\mu$m, and more preferably not more than 0.05 $\mu$m.

In cases where image formation is performed by reducing the bonding strength between the support and the image forming layer adjacent to the support, excessively high adhesion of the image forming layer to the support results in an increased remaining ratio of the image forming layer, leading to increased density. On the contrary, excessively low adhesion produces problems such that abrasion marks are easily produced in images and resistance to a film cleaner conventionally used in silver salt films is deteriorated. The compounds containing an isocyanate group include isocyanate monomers described below; and their dimmers, oligomers, polyisocyanates added with a polyhydric alcohol, polyisocyanates containing a isocyanurate ring and urethane prepolymers containing an isocyanate group in the molecule, each of which comprise the isocyanate monomer described below:
2,4-tolylenediisocyanate, 2,6-tolylenediisocyanate, p-chlorophenylisocyanate, n-butylisocyanate, methylsilanetriyltriisocyanate, 1,5-naphthalenediisocyanate, 3,3'-dimethoxybenzidine-4,4'-diisocyanate, isophoronediisocyanate, methylene-bis-(4-cyclohexylisocyanate), polymethylenepolyphenyleneisocyanate, 2,2,4-trimethylenehexamethylenediisocyanate, 2,4,4-t.rimethylhexamethylenediisocyanate, ethylisocyanate, 3-chloro-4-methylphenylisocyanate, cyclohexylisocyanate, 3,3'-dimethyl-4,4'-biphenylenediisocyanate, o-trifluoromethylphenylisocyanate, t-butylisocyanate, isobutylisocyanate, isopropylisocyanate, phenylisocyanate, methylene-bis-(phenylisocyanate), tolylenediisocyanate, methylisocyanate, 4,4'-diphenylmethanediisocyanate, and hexamethylenediisocyanate. The compound containing an isocyanate group is preferably contained in an amount of 0.1 to 50% by weight, and more 1 to 30% by weight, based on the image forming layer.

In cases when the surface energy is too low, wetability of the image forming layer is lowered, deteriorating uniform coatability and in addition, adhesion is lowered, more easily allowing abrasion marks.

According to the invention, an image forming layer with a uniform thickness can be formed, in other words, a cohesive force of the image forming layer can be made uniform within the region of formed images, leading to enhanced definition between the area exposed to high density energy light and an unexposed area to thereby obtain images with high density as well as high resolution.

Examples of supports used for the image forming material, are cited resin films such as polyacrylic acid ester, polymethacrylic acid ester, polyethylene terephthalate, polybutylene terephthalate, polyethylene terenaphthalate, polycarbonate, polyacrylate, polyvinyl chloride, polyethylene, polypropylene, polystyrene, nylon, aromatic polyamide, polyether-ehter-ketone, polysulfone, polyethersulfone, polyimide, polyetherimide, etc. Futhermore, can be cited a resin film which is formed by laminating two kinds or more of the above-mentioned resin films. By use of such supports, not only images with high resolution but also exposure to high-density energy lowers the bonding strength between the support and an image forming layer, reducing the remaining image forming layer to be removed in the exposed area and leading to a higher contrast image.

In the present invention, the support is preferably set upon heating by stretching it in film form in terms of dimension stability. Further, in the present invention, since the image forming material is imagewise exposed from the support side to a laser beam light in a later-mentioned image forming method, the support preferably has a more transparent ratio to the effective wavelength of the laser beam light. The transparent ratio of the support is usually not less than 50%, and preferably not less than 80%. The support may contain a filler such as titanium oxide, zinc oxide, barium sulfate and potassium carbonate, etc. in terms of transport characteristics and abrasion resistance unless the effect of the invention is not to be disturbed. The thickness of the support is 10 to 500 $\mu$m, and preferably 25 to 250 $\mu$m.

In the invention, a bonding strength between the support and the image forming layer is reduced for formation of an image. The bonding strength, depending on the composition of the image forming layer is sometimes low at the initial stage or the cohesive force of the image forming layer is sometimes higher than the initial bonding strength between the support and image forming layer. In such cases, not only the area exposed to high density energy light but also the non-exposed area are removed by an image forming process described later so that images with high density and high resolution corresponding to the imagewise exposure to the high density energy light can sometimes not be obtained.

The present invention is made to solve the above-described problems of image forming materials and it is intended to enhance the initial bonding strength between a support and an image forming layer to a level higher than that of the cohesive force of the image forming layer.

The surface of the support used in the invention is subjected to a treatment such as a corona discharge treatment to produce, on the surface, a reactive group capable of reacting with a polyisocyanate, such as a hydroxy group or a carboxyl group and bonding strength by hydrogen bonding or affinity can be enhanced by the image forming layer composition containing a hardener such as polyisocyanates and a polar group containing binders.

The intensity of the corona discharge treatment is preferably 2 to 40 $W/m^2$·min. more preferably 5 to 30 $W/m^2$·min., and still more preferably 10 to 25 $W/m^2$·min. In cases when the intensity is excessive, the surface is sometimes non-uniformly treated, producing non-uniformity in a bonding strength between the support and the image forming layer or remained exposed portions. As a result, even when exposed to high density energy light, it is difficult to obtain an image recording medium exhibiting uniformity and high resolution and also having a low remaining density.

The surface energy of a transparent support used in the invention is preferably 45 to 60 dyne/cm, and more preferably 48 to 55 dyne/cm. When the image forming layer according to the invention is provided on such a support, neither repellent spot nor unevenness in layer thickness is produced and the initial bonding strength between a support and an image forming layer is enhanced to a level higher than that of a cohesive force of the image forming layer so that images exhibiting high density and high resolution can be obtained in response to imagewise exposure to high density energy light.

Further, the use of a transparent support according to the invention enhances not only image resolution but also image durability of an image recording body obtained by removing portions exposed to high density energy light.

The surface energy of a support can be determined by measuring the contact angle between the support and a liquid according to the method known in the art. Thus, using a liquid such as diiodomethane, ethylene glycol or nitromethane, a drop of the liquid is placed on the support surface to measure its contact angle and the surface energy can be obtained by calculation based on the measured contact angles.

The contact angle and the definition of the surface energy is detailed in "Intramolecular Force and Surface Tension" at page 153 and 216, published by McGrow Hill.

Of treatments for modifying the surface of a transparent support used in the invention, a corona discharge treatment is preferred, in which the treatment time is relatively short, even a long length support can be readily treated and the bonding strength, after being subjected to the treatment is relatively stable.

In cases where the bonding strength between a processing layer and an image forming layer and/or the bonding strength between a support and the processing layer are reduced by exposure to high density energy light in the image forming method described later to fracture the image forming layer, the fractured image forming layer migrates into the inside of the processing layer, reducing the residual image forming layer and giving higher contrast images.

The corona discharge treatment is performed in such a manner that high frequency and high voltage are applied between an insulated electrode and a grounded conductive roll to ionize air through dielectric breakdown to generate corona discharge and the support is subjected to the corona discharge treatment by allowing the support to pass through during the discharge. Corona discharge apparatuses are classified into three types of a spark gap system, a vacuum tube system and a solid state system and an optimum oscillation system can be selected according to the use thereof.

The image forming layer of image forming materials used in the invention contains particles containing a metallic atom and a binder. The metallic atom containing particles may be any ones in which bonding with a support is weakened when exposed to high density energy light and those which are absorptive to high density energy light for imagewise exposure are preferred, and specifically, metallic atom containing particles which are absorptive within the wavelength region of 350 to 800 nm are more preferred to enhance legibility of images. Examples of metallic atom containing particles include metal containing dyes such as metallophthalocyanines and metal porphyrins; metal powdery particles; metal oxide powdery particles such as cobalt oxide, iron oxide, chromium oxide and titanium black; metal nitride powder such as niobium nitride; metal carbide powder such as tantalum carbide; and metal sulfide powder. Of these, inorganic metallic particles which are relatively uniform in the particle form and size are preferred to obtain images giving a high density and exhibiting high resolution. Examples of such inorganic metallic particles include metal particles comprised of one or two kinds of metals; their oxide, nitride or carbide particles; and various kinds of magnetic powder used as a magnetic ink. Specifically, to obtain images giving a high density and exhibiting high resolution, the particle size of the metal atom containing particles is preferably 0.03 to 0.50 $\mu$m, and more preferably 0.05 to 0.30 $\mu$m. The magnetic powder particles can be selected from ferromagnetic iron oxide powder particles, ferromagnetic metal powder particles and cubic crystal planar powdery particles, and ferromagnetic iron oxide powder particles and ferromagnetic metal powder particles are preferred. The metallic atom containing particles are incorporated into an image forming layer, preferably in an amount of 10 to 99% by weight, and more preferably 30 to 95% by weight, based on the components constituting the image forming layer.

Employed as a binder used in the image forming layer can be any binder which can maintain the metallic atom containing particles and contains a polar group. Examples thereof include polyurethane, polyesters, vinyl chloride type resin such as copolymer of vinyl chloride and vinyl ether, copolymer of vinyl chloride and glycidylvinyl ether and copolymer of vinyl chloride and vinyl acetate, polyolefinic resin such as copolymer of butadiene and acrylonirile, polyvinyl acetal type resin such as polyvinyl butyral, cellulose type resin such as nitrocellulose, polyamides, phenol resin, epoxy resin and phenoxy resin.

The polar group is preferably a hydroxy group, a carboxyl group or a sulfonic acid group. Thereby, not only the bonding strength with a support is enhanced but surface hardness is also enhanced by cross-linking with an isocyanate compound.

In cases where flaws are easily produced at the time of transporting the image forming materials or at the time of image formation, in other words, in cases where a certain extent of surface hardness of the image forming layer is required, it is preferred to harden the binder by thermohardening (or thermosetting), active energy ray hardening or wet-hardening. The thermohardening is specifically preferred to perform sufficient hardening. Examples of a thermosetting binder resin used for thermohardening and an optionally added hardening agent include a binder resin containing a hydroxy group, carboxylic acid group or sulfonic acid group and a hardening agent containing an isocyanate group; a resin or hardening agent containing an epoxy group; a resin or hardening agent containing an amino group; and a resin or hardening agent containing an acid anhydride. Further, a catalyst may be used to promote thermohardening. The hardening agent or its catalyst is incorporated preferably in an amount of 0.1 to 200 parts by weight, and more preferably 0.5 to 100 parts by weight, based on 100 parts by weight of a thermosetting binder resin. The binder resin is contained preferably in an amount of 1 to 99% by weight, and more preferably 5 to 70% by weight, based on the total components of an image forming layer.

In addition to the components described above, a light-to-heat converting material, lubricant, durability-enhancing agent, antostatic agent., dispersing agent, or filler may be incorporated into the image forming layer.

To efficiently employ high density energy light for imagewise exposure, a light-to-heat converting material may be incorporated. As the light-to-heat converting material, an organic compound and/or an inorganic compound are employed. Examples of the organic compound include dyes or dyestuffs which are absorptive in the wavelength region of 600 to 1200 nm, such as rhodacyanine dyes, oxonol dyes, merocyanine dyes, carbocyanine dyes, dicarbocyanine dyes, tricarbocyanine dyes, tetracarbocyanine dyes, pentacarbocyanine dyes, styryl dyes, pyrylium dyes, phthalocyanine dyes, and metal-containing dyes. Exemplary compounds described in Chem. Rev. 92, 1197 (1992). Examples of the inorganic compound include graphite, carbon black, cobalt oxide, iron oxide, copper oxide and titanium oxide.

Examples of the lubricant include fatty acids, fatty acid esters, fatty acid amides, (modified) silicone oil, (modified) silicone resin and carbon fluoride. Examples of the durability-enhancing agent include polyisocyanates. Examples of the dispersing agent include fatty acids having 12 to 18 carbon atoms such as laurylic acid and stearic acid and their amides, alkali metal salts and alkali earth metal salts; polyalkyleneoxide alkylphosphates, lecithin, trialkylpolyolefinoxy quaternary ammonium salts, and azo type compounds containing a carboxy or sulfon group. Examples of the antistatic agent include cationic surfactants, nonionic surfactants, polymeric antistatic agent, conductive fine particles, and compounds described in "11290 Chemical Goods" published by KAGAKUKOGYO NIPPO, at pages 875–876. Examples of the filler include inorganic fillers such as carbon black, graphite, $TiO_2$, $BaSO_4$, ZnS, $MgCO_3$, $CaCO_3$, ZnO, CaO, $WS_2$, $MoS_2$MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, silica stone, tripoli, diatomaceous earth, dolomite, and organic fillers such as polyethylene resin particles, fluorine-containing resin particles, guanamine resin particles, acryl resin. particles, silicone resin particles, and melamine resin particles.

The additives described above are each incorporated preferably in an amount of 0 to 20% by weight, and more preferably 0 to 15% by weight, based on the total components of the image forming layer.

The thickness of the image forming layer is preferably 0.1 to 5.0 µm, and more preferably 0.3 to 3.0 µm. The image forming layer may be comprised of a single layer, plural layers having the same composition (multi-layer configuration) or plural layers having different compositions (multi-layer structure).

To obtain images giving a high density and exhibiting high resolution, it is preferred that the image forming layer containing a resin containing a polar group and an isocyanate group-containing compound or an image forming material having a protective layer formed on the image forming layer exhibits a surface hardness of not less than a given value. In cases where the surface of the image forming layer is soft, the cohesive force of the image forming layer is generally low. When an area exposed to high density energy light is transferred to an adhesive sheet or a peeling layer, the image forming layer causes cohesive failure, producing phenomena such that peeling can not be made at the interface between a support and an image forming layer, or a part of an unexposed area of the image forming layer is transferred so that images giving a high density and high resolution cannot be obtained.

To improve such defects, with respect to surface hardness of an image forming layer or a protective layer, the outermost layer of the image forming material preferably exhibits a scratch hardness of 40 to 100 g, more preferably 70 to 100 g, and still more preferably 75 to 95 g. Specifically, the image forming layer preferably exhibits a scratch hardness of 40 to 100 g and more preferably 45 to 95 g; and an image forming material having a protective layer preferably exhibits a scratch hardness of 70 to 100 g, and more preferably 75 to 95 g . By providing such a surface hardness to an image forming layer or a protective layer, not only images giving a high density and exhibiting high resolution can be obtained but also an image-recorded material can be obtained without forming uneven density in exposed and/or unexposed areas. A means for achieving at least a 40 g scratch hardness in an image forming layer or a protective layer include a binder contained in the image forming layer being mainly comprised of a resin exhibiting not less than 90° C. of a glass transition temperature and/or not less than 90° C. of a thermally deforming temperature, hardening a binder by use of a hardening resin, and subjecting the image forming layer surface to calender finishing. Herein, the scratch hardness can be determined in a scratch hardness test using a sapphire needle with 0.05 mm diameter. Thus, when a conical sapphire 0.05 mm diameter needle (90°) is loaded onto a surface property tester HEIDON-14DR (available from Shinto Scientific Co. ltd.) and scratching is made at a speed of 10 cm/sec, while vertically loading a given weight, the scratch hardness is defined as the weight at the time when layer peeling has occurred.

In one of the preferred embodiments of the invention, the image forming material comprises a transparent support having thereon an image forming layer and further thereon having a protective layer. In the protective layer is used a binder resin. As a binder resin is usable any one which hold additives and fillers. Examples thereof include polyurethane, polyesters, vinyl chloride type resin such as copolymer of vinyl chloride and vinyl ether, copolymer of vinyl chloride and glycidylvinyl ether and copolymer of vinyl chloride and vinyl acetate, polyolefinic resin such as copolymer of butadiene and acrylonirile, polyvinyl acetal type resin such as polyvinyl butyral, polyvinyl acetoacetal or polyvinyl formal, cellulose type resin such as nitrocellulose, styrene type resin such as copolymer of styrene and butadiene, acryl tyoe resin such as polymethyl methacrylate, polyamides, phenol resin, epoxy resin and phenoxy resin, polyvinyl alcohol, and gelatin.

To enhance the surface hardness by use of such binders, the method described above can be employed. Thus, at least 70 g of the surface hardness (i.e., scratch hardness) can be achieved by containing, in the protective layer, a binder mainly comprised of a resin exhibiting a glass transition temperature of 90° C. or higher and/or a resin exhibiting a thermally deforming temperature of 90° C. or higher or by hardening with a hardening resin as a binder for the protective layer. Concretely, it is preferred to harden the binder through thermo-hardening (or thermosetting), active energy-ray hardening or wet-hardening. The thermohardening and/or active energy-ray hardening are specifically preferred to perform sufficient hardening. Examples of a thermosetting binder resin used for thermohardening and an optionally added ghardening agent include a binder resin containing a hydroxy group, carboxylic acid group or sulfonic acid group and an isocyanate group containing hardening agent; a resin or hardening agent containing an epoxy group; a resin or hardening agent containing an amino group; and a resin or hardening agent containing an acid anhydride. Further, a catalyst may be used to promote thermohardening. In cases where an isocyanate type hardening agent is employed, for example, phenoxy type resin, epoxy type resin, cellulose type resin, acetal type resin, acryl type resin, urethane type resin, vinyl chloride type resin or polyester type resin is preferably employed. The hardening agent or its catalyst is incorporated preferably in an amount of 0.1 to 200 parts by weight, and more preferably 0.5 to 100 parts by weight, based on 100 parts by weight of the thermosetting binder resin.

To achieve active energy-ray hardening, commonly known compounds containing an ethylenically unsaturated double bond or compounds containing an epoxy group can be employed in combination with a polymerization initiator or a cross-linking agent. Examples of the compounds containing an ethylenically unsaturated double bond include compounds described in "11290 Chemical Goods" published by KAGAKUKOGYO NIPPO, at pages 286–294 and compounds described in "UV-EB-Hardening Handbook (Raw Material)" published by KOBUNSHI KANKOKAI at pages 11–65. Examples of the polymerization initiator or cross-linking agent include amine compounds, acid anhydrides and proton-generating agents. The polymerization initiator or the cross-linking agent is added preferably in an amount of 0.1 to 100 parts by weight, and more preferably 0.5 to 50 parts by weight, based on 100 parts by weight of the polymerizing compound described above.

The binder resin may be used alone or in combination. The content of the binder resin in the protective layer preferably is 10 to 99.55 by weight, and more preferably 40 to 98% by weight, based on the total components of the protective layer. Hardening the protective layer by incorporating a hardening agent not only enhances durability of formed images but also prevents background staining in ablated areas. Further, the protective layer enhances overall strength of the image forming layer. Furthermore, when images are formed, the sharp boundary between an ablated area and a non-ablated area can be maintained, leading to enhanced resolution.

Additives (lubricant) such as wax, a silicon compound or a fluorinated compound are preferably incorporated into the image forming layer to enhance image durability. Examples of the wax include solid waxes such as beeswax, candelilla wax, parafin wax, ester wax, montan wax, carnauba wax, amide wax, polyethylene wax, and microcrystalline wax. Examples of the silicon compounds (including those which are in the form of wax) include straight silicone oils such as dimethylsilicone oil, methylphenylsilicone oil, or methyl hydrogen silicone oil; radical-reactive silicone oils such as olefin-modified silicone oil, polyether-modified silicone oil, epoxy-modified silicone oil, epoxy-polyether-modified silicone oil, alcohol-modified silicone oil, fluorine-modified silicone oil, amino-modified silicone oil, phenol-modified silicone oil, mercapto-modified silicone oil, carboxy-modified silicone oil, higher fatty acid-modified silicone oil, carnauba-modified silicone oil, amide-modified silicone oil, or (metha) acryl-modified silicone oil; endo-reactive silicone oils such as silicone diol or silicone diamine; and organic modified silicone oils which are modified with a halogen group, an alkoxy group, an ester group, an amido group or an imido group.

Examples of the fluorinated compounds include fluororesins such as polytetrafluoroethylene, tetrafluoroethylene copolymer, (e.g., with alkylvinyl ether or ethylene), polyvinylidene fluoride, fluoroalkyl methacrylate or fluorinr-containing rubber; and low molecular weight fluorinated compounds such as perfluoro-polyether oil, fluorinated alcohol, fluorinated carboxylic acid, perfluoroalkylcarboxylate, perfluoroalkyl quaternary ammonium salt, perfluoroalkyl betaine, perfluoroalkylethylene oxide adduct or perfluoroalkyloligomer. These compounds each are incorporated into the image forming layer, preferably in an amount of 0.1 to 30 wt % solid, and more preferably 0.5 to 20 wt % solid.

The protective layer formed on the image forming layer preferably contains fine particles. The fine particles include inorganic fillers such as carbon black, graphite, $TiO_2$, $BaSO_4$, ZnS, MgCO3, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, silica stone, tripoli, diatomaceous earth, dolomite, and organic fillers such as polyethylene resin particles, fluorine-containing resin particles, guanamine resin particles, acryl resin particles, silicone resin particles, and melamine resin particles. The fine particles further include inorganic particles and organic resin particles. Examples of the inorganic particles include silica gel, calcium carbonate, titanium oxide, acid clay, active clay, and alumina. examples of the organic fine particles include fluorinated compound particles, and resin particles such as guanamine resin particles, acryl resin particles or silicone compound particles. The content of the inorganic or organic resin particles is preferably 0.1 to 70% by weight.

In the invention, fine particles having narrow and uniform particle distribution are preferred. Concretely, silicon resin fine particle (by the trade name of Tospar, produced by Toshiba Silicon Co., Ltd.), cross linkage forming acryl fine powder MR series, cross linkage forming polystyrene fine powder SGP series, and acryl super fine powder MP series (produced by Soken Kagaku Co., Ltd.) can be used.

The fine particles incorporated into the protective layer enhances effects of the invention through partial protrusion of the particle from the surface. Accordingly, when the average particle size (r) is larger than the thickness (d) of the protective layer, almost particles efficiently partial-protrude from the surface. The average size of the fine particles is preferably 0.3 to 20 $\mu$m, and more preferably 0.8 to 4.5 $\mu$m. The average coverage of the fine particles is preferably 5 to 150 mg/m$^2$, and more preferably 10 to 100 mg/m$^2$. In cases where the surface of the fine particles has a polymerizing functional group, adhesion of the fine particles to the layer is enhanced, leading to enhanced image durability.

The thickness of the protective layer is preferably 0.03 to 1.0 $\mu$m, more preferably 0.05 to 0.8 $\mu$m, and still more preferably 0.1 to 0.4 $\mu$m.

In the image forming method to be described later, a peeling layer, which is provided to transfer images by peeling after exposure, may be formed of a layer comprising a self-supporting resin. Alternatively, a resin film which is used as a support, may be used as a peeling layer. An adhesion layer may be provided between the peeling layer and the image forming layer.

The adhesion layer or the sticking layer referred herein has itself adhesiveness or stickiness and the adhesiveness or the stickiness exhibits the effect by heat and pressure, for examples, a resin having a low softening point, an adhesion giving agent and a heat solvent may be optionally selected and used so as to form the adhesion layer or the sticking layer.

As the resins having low softening point, are cited ethylene copolymer such as ethylene-vinylacetate, ethylene-ethylacrylate; polystyrene type resin such as styrene-butadiene, styrene-isoprene, styrene-ethylene-butylene; polyester type resin; polyolefin type resin such as polyethylene, polypropylene; polyvinylether type resin; acryl type resin such as polybutylmethacrylate; ionomer type resin; cellulose type resin; epoxy type resin; vinylchloride type resin such as vinylchloride-vinylacetate copolymer. As the adhesion giving agents, are cited unmodified or modified rosin derivatives such as rosin, hydrogen treated rosin, rosin maleic acid, polymerized rosin and rosin phenol, terpene and petroleum resin and their modified substances. The heat solvent is solid at room temperature and liquidized or softened by heating reversibly. As the examples of heat solvents, are cited monomeric molecule compounds such as terpineol, menthol, acetamide, benzamide, coumarin, benzyl cinnamate, diphenylether, crownether, camphor, p-methylacetophenone, vanillin, dimethoxybenzaldehyde, p-benzylbiphenyl, stilbene, margaric acid, eicosanol, cetyl palmitate, stearic acid amide, behenyl amine; and waxes such as bees wax, candelilla wax, paraffin wax, ester wax, montan wax, carnauba wax, am-de wax, polyethylene wax, micro crystalline wax; rosin derivatives such as ester gum, rosin maleic acid resin, rosin phenol resin; high molecular compounds such as phenol resin, ketone resin, epoxy resin, diarylphthalate resin, terpene type hydrocarbon resin, cyclopentadiene resin, polyolefin type resin, polycaprolactone type resin, polyolefinoxide including polyethyleneglycol, poly propyleneglycol.

The thickness of the peeling layer is preferably 0.1 to 100 $\mu$m, and more preferably 0.5 to 50 $\mu$m; and the thickness of the adhesion layer is preferably 0.1 to 40 $\mu$m, and more preferably 0.3 to 30 $\mu$m.

To form the image forming layer, for example, metal atom containing particles, a binder and optional adjuvants such as, a light-to-heat converting material, a lubricant, a durability-enhancing agent, a dispersing agent, an antistatic agent and a filler are kneaded with a solvent to prepare a concentrated composition for the image forming layer; then, the composition is diluted to prepare a coating composition, coated onto a support and dried to form the image forming layer.

The solvents include alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofuren, dioxane), halogenated solvents (chloroform, dichlorobenzene), and amide type solvents (dimethylformamide, N-.methylpyrrolidone). As the kneaders for an image forming layer composition, suitable examples include two-roll mills, three-roll mills, ball mills, pebble mills, coball mills, tron mills, sand mills, sand grinders, sqegvari attritor, high-speed impeller dispersers, high-speed stone mills, high-speed impact mills, dispersers, high-speed mixers, homogenizers, supersonic dispersers, open kneaders, and continuous kneaders.

Next, the method for preparing image forming materials according to the invention will be described.

On a support are layered an image forming layer and a protective layer in this order. At least one side of the support is subjected to a surface-modifying treatment such as a corona discharge treatment and is then further subjected to a dust-removing treatment by means of at least one of suction, adhesive roll and wiping. On the thus surface-treated side of the support are coated the image forming layer and the protective layer, which are then dried.

The corona discharge treatment enhances the initial bonding strength between the support and the image forming layer to a level higher than that of the cohesive force of the image forming layer so that repellent spots or uneven layer in thickness are not produced, and images giving a high density and exhibiting high resolution can be obtained in response to imagewise exposure to high density energy light. The use of the thus surface-modified support not only enables to obtain images exhibiting high resolution but also enhances durability of images formed by removing an area exposed to high density energy light. The intensity of the corona discharge treatment is preferably 2 to 40 W/m²·min. more preferably 5 to 30 W/m²·min., and still more preferably 10 to 25 W/m²·min. In cases when the intensity is excessive, the surface is sometimes non-uniformly treated, producing non-uniformity in a bonding strength between the support and the image forming layer or remained exposed portions. As a result, even when exposed to high density energy light, it is difficult to obtain an image recording medium exhibiting uniformity and high resolution and having a low remaining density. Not only one side of the support but both sides thereof may be subjected to the corona discharge treatment. In this case, the intensity of the corona discharge treatment is at the same levels as described above.

After being subjected to the corona discharge treatment, the support is further subjected to a dust removing treatment to prevent production of repellent spots or pin-holes, leading to an image recorded material with high resolution and reduced remaining density. The preferred dust removing treatments include suction, an adhesive roll and wiping. Exemplarily, dust removal by suction is conducted in such a manner that a suction nozzle is allowed to approach to the transporting support without touching thereto and dust is removed through the nozzle. In this case, the dust removal can also be efficiently performed by applying an ultrasonic thereto. Dust removal by an adhesive roll is conducted in such a manner that a roll having tackiness on the periphery is rolled while being in contact with a support. Dust removal by wiping is conducted in such a manner that a non-woven fabric is wound up while being in contact with the support.

In order to coat an image forming layer on a support, coating is carried out by an extrusion method, which is then dried. A calender treatment may be carried out in order to optionally orient the magnetic particles and make the surface of the image forming layer more uniform.

When the image protective layer is coated on the image forming layer, each layer may be coated separately, and the layers may be multilayer coated by the wet-on wet coating method. In carrying out the wet-on-wet multilayer coating, a combination of an extrusion coater with a reverse roll, a gravure roll, an air doctor coater, a blade coater, an air knife coater, a squeeze coater, a dip coater, a bar coater, a transfer roll coater, a kiss coater, a casting coater or a spray coater can be used. In wet-on-wet multilayer coating, since an upper layer is coated on an under layer while the under layer is wet, the adhesion between the upper and under layers is enhanced.

When a peeling layer is layered on an image forming layer, if the peeling layer is a self-supporting resin, the resin is dissolved in a solvent, then, coated and subsequently dried in a manner similar to the image forming layer. In cases where a resin film used as a support is employed as a peeling layer, a heat-sealing film such as a polyethylene or polypropylene film is laminated onto the image forming layer and subjected to heat-compression to form the peeling layer. In the case of non-heat-sealing film, an adhesion layer is provided on the image forming layer and further thereto, the film is laminated. Thus, an adhesion layer-forming composition is coated on the image forming layer and dried, after which the resin film is laminated thereto. Alternatively, after coating an adhesion layer forming composition on the film or allow the composition to fuse and to be extrude onto the film, the adhesion layer side is laminated with the image forming layer and subjected to a heat compression treatment using a heated roll or a hot-stamp to provide a peeling layer. The heated roll is employed at a temperature of about 180° C. (preferably, 30 to 160° C.) and at a pressure of 0.1 to 20 kg/cm² (preferably, 0.5 to 15 kg/cm²), while transported at a speed of 1 to 400 mm/sec (preferably, 5 to 300 mm/sec). The hot-stamp is employed at a temperature of room temperature to about 180° C. (preferably, 30 to 150° C.) and at a pressure of 0.05 to 10 kg/cm² (preferable 0.5 to 5 kg/cm²) over a period of 0.1 to 50 sec (preferably 0.5 to 20 sec.).

In the invention, besides the above-described support, image forming layer and peeling layer, other layer(s) may be provided. For example, on the side of the support opposite the image forming layer, a backing layer may be provided to enhance the antistatic property and transportability and to minimize multi-feeding. The backing layer thickness is preferably 0.05 to 10 μm, and more preferably 0.1 to 5 μm.

Next, an image forming method by use of the image forming material according to the invention will be described. In the invention, when an image forming layer of the image forming material is brought into contact with an image receiving layer of a receiving material and exposed to high density energy light, the bonding strength of the exposed image forming layer to the receiving material does not substantially change but the bonding strength of the exposed image forming layer to the support is reduced, peeling off the receiving material from the image forming material so that the exposed image forming layer can be transferred to the receiving material to form an image. With respect to the imagewise exposure, to obtain a high resolving power, the light source is preferably an electromagnetic wave capable of making the energy spots smaller, and ultraviolet rays, visible light and an infrared light within the wavelength region of 1 nm to 1 mm are specifically preferred. Examples of the light source emitting such light energy include a laser, an emission diode, a xenon flash lamp, a halogen lamp, carbon arc lamp, a metal halide lamp, a tungsten lamp, a quarts mercury lamp and a high pressure mercury lamp. The energy applied is optionally adjusted by adjusting the exposure distance, an exposure time or the exposure strength according to kinds of image forming materials used. In cases when subjected to overall exposure, a masking material formed of a light-shielding material is superposed onto an intended negative image pattern and then exposed. In the case of using an array type light source such as an emission diode array or in the case of controlling exposure by an optical shutter material such as liquid crystal or PLZT using a light source such as a halogen lamp, metal halide lamp or tungsten lamp, digital exposure in response to image signals can be made, in which direct writing is made without using any masking material. However, in this case, the optical shutter material is needed in addition to the light source so that a light source is essential for digital exposure. When a laser light is used, the light can be condensed into a beam form and a latent image is formed using a scanning exposure according to an image. Laser light easily condenses the exposure spots to a small size and therefore, a highly resolved image can be obtained. The laser light used in the invention is well known. The laser source includes solid lasers such as a ruby laser, a YAG laser, a glass laser, a gas laser such as a He—Ne laser, an Ar laser, a Kr laser, a $Co_2$ laser, a CO laser, a He—Cd laser, a $N_2$ laser, an eximer laser, an semiconductor laser such as an InGaP laser, a AlGaAs laser, a GaAsP laser, an InGaAs laser, an InAsP laser, $CdSnP_2$ laser or a GaSb laser, a chemical laser, and a dye laser. Of these laser light sources, a laser having a 600 to 1200 nm wavelength is preferable in terms of sensitivity in order to occur ablation in the exposed portions, since a light energy can be effectively converted to heat energy.

Exposure using a high density energy light can be carried out from both the support side and the image forming layer side.

Various methods for peeling off the image receiving material can be applied, includind a peeling angle-fixed method by use of a peeling plate or a peeling roll and a hand-peeling method.

An imagewise exposure such that only a bonding strength at the interface between a support and an image forming layer is reduced without rupturing the exposed image forming layer is preferred in terms of no dust-scattering during exposure and uniform transfer of the exposed portion.

EXAMPLES

The present invention will be described based on examples, but the embodiment of the invention are not limited to these.

Preparation of Image Forming Material

Inventive and comparative image forming materials were prepared using a support, an image forming layer and a peeling layer described below. Prepared image forming materials are shown in Table 2.

Support

Supports which were treated according to the following procedure were employed.
1) Transparent 100 μm thick polyethylene terephthalate film (produced by Diafoil Hoechst Co. Ltd., T-100), the image forming layer side of which was not subjected to a corona discharge treatment, exhibiting a surface energy of 43 dyne/cm.
2) Transparent 100 μm thick polyethylene terephthalate film (produced by Diaifoil Hoechst Co. Ltd., T-100), the image forming layer side of which was subjected to a corona discharge treatment at an intensity of 2 $W/m^2$ min, exhibiting a surface energy of 45 dyne/cm.
3) Transparent 100 μm thick polyethylene terephthalate film (produced by Diafoil Hoechst Co. Ltd., T-100), the image forming layer side of which was subjected to a corona discharge treatment at an intensity of 8 $W/m^2$ min, exhibiting a surface energy of 48 dyne/cm.
4) Transparent 100 μm thick polyethylene terephthalate film (produced by Diafoil Hoechst Co. Ltd., T-100), the image forming layer side of which was subjected to a corona discharge treatment at an intensity of 12 $W/m^2$ min, exhibiting a surface energy of 52 dyne/cm.
5) Transparent 100 μm thick polyethylene terephthalate film (produced by Diafoil Hoechst Co. Ltd., T-100), the image forming layer side of which was subjected to a corona discharge treatment at an intensity of 25 $W/m^2$ min, exhibiting a surface energy of 55 dyne/cm.
6) Transparent 100 μm thick polyethylene terephthalate film (produced by Diafoil Hoechst Co. Ltd., T-100), the image forming layer side of which was subjected to a corona discharge treatment at an intensity of 40 $W/m^2$ min, exhibiting a surface energy of 60 dyne/cm.
7) Transparent 100 μm thick polyethylene terephthalate film (produced by Diafoil Hoechst Co. Ltd., T-100), the image forming layer side of which was subjected to a corona discharge treatment at an intensity of 50 $W/m^2$ min, exhibiting a surface energy of 63 dyne/cm.
8) Transparent 100 μm thick polyethylene terephthalate film (produced by Diafoil Hoechst Co. Ltd., T-100), the image forming layer side of which was subjected to a corona discharge treatment at an intensity of 60 $W/m^2$ min, exhibiting a surface energy of 67 dyne/cm.

The thus prepared supports are summarily shown in Table 1,

TABLE 1

| Support No. | Corona Discharge ($W/m^2$ min) | Surface Energy (dyne/cm) |
| --- | --- | --- |
| 1 | — | 43 |
| 2 | 2 | 45 |
| 3 | 8 | 48 |
| 4 | 12 | 52 |
| 5 | 25 | 55 |
| 6 | 40 | 60 |
| 7 | 50 | 63 |
| 8 | 60 | 67 |

Dust Removing
1) Pior to providing an image forming layer, dust-removing by suction was made at an airflow rate of 15 m/sec, while applying ultrasonic to the support.
2) Pior to providing an image forming layer, dust-removing was made by pressing an adhesive roller to the image forming layer of the support.
3) Pior to providing an image forming layer, dust-removing was made by pressing an unwoven fabric to the image forming layer-side of the support.

Arrangement of Image Forming Layer and Protective Layer
(1) The following image forming layer composition was dispersed with kneading using a Henschel mixer and a sand mill to obtain mix 1 and mix 2. The mix 1, mix 2 and a polyisicyanate compound (Coronate HX, effective component 100%, produced by NIPPON POLYURETANE INDUSTRY. Co. Ltd.) were mixed in a weight ratio of 100:2.4:3 while stirring with a disolver to obtain coating solutions 1 and 2 for an image forming layer.

The coating solutions each were dispersed by a ultrasonic homogenizer, then coated on a support as shown in Table 2 using an extrusion coater and dried. Further, subsequently, calender finishing was conducted using a heat roll at a temperature of 100° C., a linear pressure of 150 kg/cm and a transporting speed of 60 m/sec, and after subjected to aging at 60° C. for a period of 120 hrs., materials with a 1.2 μm thich image forming layer were obtained.

Image Forming Layer Composition

Coating Solution 1

| | |
|---|---|
| Fe—Al type ferromagnetic metal powder MAP T1659SB (produced by TOYOBO Co. Ltd.) | 100 parts |
| Polyurethane resin Vylon UR4122 (produced by TOYOBO Co. Ltd.) | 13.5 parts |
| Phenoxy resin PKHH (produced by Phenoxy Associate Corp.) | 1.5 parts |
| Phospholic acid ester PHOSPHANOL RE610 (produced by TOHO Chemical Ind. Co. Ltd.) | 3 parts |
| Polyisocyanate compound Coronate HX (produced by NIPPON POLYURETANE INDUSTRY. Co. Ltd.) | 5 parts |
| Methyl ethyl ketone | 105 parts |
| Toluene | 105 parts |
| Coating solution 2 | |
| Alumina High-purity Alumina HIT60G (produced by SUMITOMO Chemical Corp.) | 100 parts |
| Polyurethane resin Vylon UR4122 (produced by TOYOBO Co. Ltd.) | 15 parts |
| Methyl ethyl ketone | 41.3 parts |
| Toluene | 41.3 parts |
| Cyclohexanone | 35.4 parts |

Protective Layer Composition

A coating solution for a protective layer and having the following composition was prepared, coated on the image forming layer in a coverage of 0.25 g/m² by the wire bar coating method, dried and further thermally hardened at 60° C. for a period of 72 hrs.

| | |
|---|---|
| Phenoxy resin PKHH (produced by Phenoxy Associate Corp.) | 3.0 parts |
| Polyester resin Elitel 3690 (produced by UNITIKA Co. Ltd.) | 3.65 parts |
| Polyethylene wax dispersion Microflat CE-155 (produced by KOYO KAGAKU Co. Ltd.) | 2.33 parts |
| Silica Cylohobic 200 (produced by Fuji Silysia Chemicla Co. Ltd.) | 0.2 parts |
| Polyisocyanate compound Coronate HX (produced by NIPPON POLYURETANE INDUSTRY. Co. Ltd.) | 3.0 parts |
| Alumina High-purity Alumina HIT60G (produced by SUMITOMO Chemical Corp.) | 1.0 parts |
| Toluene | 120.0 parts |
| Cyclohexanone | 80.0 parts |

(2) Image forming layer and protective layer were formed in the same manner as in (1) described above, except that coating solution 1 was replaced by the following composition:

| | |
|---|---|
| Fe—Al type ferromagnetic metal powder MAP T1659SB (produced by TOYOBO Co. Ltd.) | 100 parts |
| Polyurethane resin Vylon UR4122 (produced by TOYOBO Co. Ltd.) | 10 parts |
| Polyester resin Vylon 280 (produced by TOYOBO Co. Ltd.) | 5 parts |
| α-Alumina (av. particie size of 0.15 μm) | 5 parts |
| Stearic acid | 1 part |
| Butyl stearate | 1 part |
| Polyisocyanate compound Coronate HX (produced by NIPPON POLYURETANE INDUSTRY. Co. Ltd.) | 5.0 parts |
| Cyclohexanone | 100 parts |
| Methyl ethyl ketone | 100 parts |
| Toluene | 100 parts |

(3) Image forming layer and protective layer were formed in the same manner as in (1) described above, except that coating solution 1 was replaced by the following composition:

| | |
|---|---|
| Fe—Al type ferromagnetic metal powder MAP T1659SB (produced by TOYOBO Co. Ltd.) | 100 parts |
| Polyurethane resin Vylon UR4122 (produced by TOYOBO Co. Ltd.) | 10 parts |
| Phospholic acid ester PHOSPHANOL RE610 (produced by TOHO Chemical Ind. Co. Ltd.) | 3 parts |
| Polyisocyanate compound Coronate HX (produced by NIPPON POLYURETANE INDUSTRY. Co. Ltd.) | 5 parts |
| Methyl ethyl ketone | 105 parts |
| Toluene | 105 parts |
| Cyclohexanone | 90 parts |

(4) Image forming layer and protective layer were formed in the same manner as in (1) described above, except that, after coating drying end calender finishing of the image forming layer, the aging treatment was not conducted.

(5) Image forming layer and protective layer were formed in the same manner as in (1) described above, except that the polyisocyanate compound used in the coating solution 1 was replaced by a polyisocyanate compound Coronate 3041 (produced by NIPPON POLYURETANE INDUSTRY. Co. Ltd.).

(6) Image forming layer and protective layer were formed in the same manner as in (1) described above, except that the polyisocyanate compound used in the coating solution 1 was replaced by a polyisoyanate compound MILLIONATE 200 (produced by NIPPON POLYURETANE INDUSTRY. Co. Ltd.).

(7) Image forming layer and protective layer were formed in the same manner as in (1) described above, except that the polyisocyanate compound used in the coating solution 1 was removed.

Peeling Layer

One side of a transparent 38 μm thick polyethylene terephthalate film T1OOE (produced by Diafoil Hoechst Co. Ltd.) was subjected to a treatment to make peeling easier. On the treated side of the film, the following peeling layer composition was coated by a bar coater and dried to form a peeling layer. Further thereon was provided a 1.30 μm thick adhesion layer to obtain a peeling sheet.

Peeling Layer Composition

| | |
|---|---|
| Urethane resin NIPPOLAN 3100 (produced by NIPPON POLYURETANE IND. Co. Ltd.) | 4.90 parts |

-continued

| | |
|---|---|
| Silicone resin particles Tospearl 120 (produced by TOSHIBA Silicones Co. Ltd.) | 0.10 parts |
| Toluene | 42.75 parts |
| Methyl ethyl ketone | 42.75 parts |
| Cyclohexanone | 9.50 parts |

Subsequently, the protective layer side of a image forming material was brought into contact with the peeling layer side of the peeling sheet and subjected to a heat-pressing treatment (at a roll temperature of 60° C., a transporting speed of 100 mm/sec and a pressure of 6.0 kg/cm) to prepare an integrated image forming material.

Image Formation

The thus prepared image forming materials were exposed to laser light using Postscript Data (PS Data) and EV Laser Proofer (produced by Konica Corp.) at a rotation speed of 425 rpm and a power of 100%, while focusing onto the interface between the transparent support and the image forming layer. After exposure, peeling was carried out and the obtained images were evaluated with respect to resolution, staining in an exposed area, abrasion resistance and film cleaner resistance, based on the criteria described below. In the evaluation, a dot percentage indicates that of an unexposed area. With respect to pin hole, when the peeling sheet was peeled off from the integrated image forming material before exposure, the number of lost coat of at least 10 $\mu$m occurred in the image forming layer per unit area was counted.

Evaluation of Resolution

Using laser light with an output of 120 mW at the P-focal surface and an exposure energy of 400 mJ/cm$^2$, scanning exposure was made with a beam diameter of 6 $\mu$m, at a scanning pitch of 6 $\mu$m and at an average exposure amount of the overall surface of the image forming material to form images. Resolution was evaluated based on the resolved line number per 1 mm (N), according to the following criteria:
  A: 80<N
  B: 40≦N≦80
  C: 20≦N<40
  D: N<20

In the above, only A and B are acceptable levels for practical use.

Staining in Exposed Areas (remaining density)

Using a 175 frequency screen with square-form dots, 0% halftone dot images were formed at a screen angle of 45°. The transmission density of the formed halftone dot images was measured at 30 random points, using the visual density of densitometer X-rite 310TR (available from X-rite Corp.). Evaluation was made with respect to an average density difference, based on the following criteria:
  A: an average density difference of less than 0.050;
  B: an average density difference of not less than 0.050 and less than 0.060;
  C: an average density difference of not less than 0.060 and less than 0.075; and
  D: an average density difference of not less than 0.075.

In the above, only A and B are acceptable levels for practical use.

Abrasion Resistance

Using a 175 frequency screen with square-formed dots, 50% halftone dot images were formed at a screen angle of 45°. The thus formed halftone dot image was fixed and brought into contact with the protective layer-side of another image forming material, in which no image had been formed. Using an apparatus capable of allowing reciprocating movement at a constant speed, while being loaded at a given weight, this protective layer side with a contact area of 1 cm (width direction)×2 cm was, allowed to reciprocate five times at a transport speed of 50 cm/sec or 10 cm/sec over a transporting distance of 20 cm, while loaded at 300 g/cm$^2$. Thereafter, the abraded surface was observed with respect to abrasion marks and evaluated based on the following criteria:
  A: No abrasion mark was observed under microscopic observation of the halftone dot image surface;
  B: Abrasion marks on the protective layer were observed Under microscopic observation of the halftone dot image surface;
  C: Abrasion marks extending into a colorant layer were observed in microscopic observation of the halftone dot image surface; and
  D: Transmitted abrasion marks were observed when observing halftone dot images under transmitted light.

Film Cleaner Resistance

50% halftone dot images were formed and the formed images were fixed. Film cleaner 1 (MC High Clean ECO, available from MAKOTO KAGAKU Co. Ltd.) or film cleaner 2 (New Film Cleaner NF-7, available from KOYO KAGAKU Co. Ltd.) was allowed to drop onto the image surface. After being allowed to stand for 5 sec., Soft Pat (available from DAINIKU Co. Ltd.) was brought into contact with the image surface. Using the same apparatus used in the evaluation for abrasion resistance, the Soft Pat with a contact area of 1 cm (width direction)×2 cm was allowed to be reciprocated 10 times at a transport speed of 85 cm/sec over a transporting distance of 10 cm, while loaded at 500 g/cm$^2$. Transmission densities before and after dripping of the film cleaner were measure with respect to 30 points at random, using the visual density of densitometer X-rite 310TR (available from X-rite Corp.). Evaluation was made with respect to the difference in an average density between before and after dropping the film cleaner, based on the following criteria:
  A: an average density difference less of than 0.010;
  B: an average density difference of not less than 0.050 and less than 0.025;
  C: average density difference of not less than 0.025 and less than 0.050; and
  D: an average density difference of not less than 0.050.

In the above, only A and B are acceptable levels for practical use.

Pin Hole

The peeling layer was peeled off from an unexposed portion of an image forming material provided with a peeling layer. The number of produced pin holes with a breadth of 10 $\mu$m or more per unit area was counted through transmitted light and evaluated, based on the following criteria:
  A: less than 5 per m$^2$;
  B: not less than 5 per M$^2$ and less than 15 per M$^2$;
  C: not less than 15 per m$^2$ and less than 50 per m$^2$; and
  D: not less than 50 per M$^2$.

The obtained results are shown in Table 3.

TABLE 2

| Image Forming Material | Suppot | Dust Removing | Layer Arrangement | Scratch Hardness (g) IFL* | PL* | Remark |
|---|---|---|---|---|---|---|
| 1 | 3 | 1 | 2 | 45 | 72 | Inv. |
| 2 | 4 | 1 | 2 | 48 | 75 | Inv. |
| 3 | 5 | 1 | 2 | 52 | 85 | Inv. |
| 4 | 6 | 1 | 2 | 55 | 90 | Inv. |
| 5 | 4 | 1 | 1 | 50 | 80 | Inv. |
| 6 | 2 | 1 | 1 | 40 | 70 | Inv. |
| 7 | 4 | 1 | 5 | 55 | 90 | Inv. |
| 8 | 4 | 1 | 6 | 60 | 95 | Inv. |
| 9 | 4 | 2 | 1 | 50 | 80 | Inv. |
| 10 | 4 | 3 | 1 | 50 | 80 | Inv. |
| 11 | 4 | 1 | 4 | 40 | 70 | Inv. |
| 12 | 4 | 1 | 7 | 30 | 60 | Comp. |
| 13 | 7 | 1 | 2 | 57 | 93 | Comp. |
| 14 | 8 | 1 | 2 | 60 | 95 | Comp. |

*IFL: Image forming layer
PL: Protective layer

TABLE 3

| Image Forming Material | Resolution | Remaining density | Cleaner Resistance | Abrasion Resistance | Pin Hole | Remark |
|---|---|---|---|---|---|---|
| 1 | A | A | B | B | B | Inv. |
| 2 | A | A | B | B | B | Inv. |
| 3 | A | A | A | A | A | Inv. |
| 4 | B | B | A | A | C | Inv. |
| 5 | A | A | B | B | B | Inv. |
| 6 | A | A | B | C | C | Inv. |
| 7 | B | A | A | A | A | Inv. |
| 8 | B | B | A | A | A | Inv. |
| 9 | A | A | B | B | A | Inv. |
| 10 | A | A | B | B | B | Inv. |
| 11 | A | A | C | B | B | Inv. |
| 12 | B | B | D | D | D | Comp. |
| 13 | A | C | C | A | C | Comp. |
| 14 | B | C | C | A | C | Comp. |

As apparent from the Tables, inventive samples gave superior ablation type images, exhibiting superior resolution and improved remaining density, as compared to comparative samples. According to the present invention, cleaner resistance and abrasion resistance were enhanced and image forming materials with little pin hole were obtained.

Disclosed embodiments can be varied by a skilled person without departing from the spirit and scope of the invention.

What is claimed is:

1. A method for preparing an image forming material comprising a support and at least an image forming layer, the method comprising the steps of:

(i) subjecting at least one side of the support to a corona discharge treatment at 2 to 40 W/m²/min to modify the surface of the support, (i-a) subjecting the surface-modified support to a dust removing treatment which is performed by applying at least one of suction, adhesive-roll, and wiping, and (ii) forming the image forming layer on the surface-modified support by coating, wherein the image forming layer contains a resin containing a polar group selected from the group consisting of a hydroxy group, a carboxylic acid group and a sulfonic acid group and a compound containing an isocyanate group, and the modified surface of the support exhibits a surface energy of 45 to 60 dyne/cm, and wherein at least a part of the image forming layer is adapted to be made removable upon image wise exposure to light, such that the removable image forming layer forms an image when removed.

2. The method of claim 1, wherein the corona discharge treatment is performed at an intensity of 5 to 30 W/m²/min.

3. The method of claim 1, wherein the method further comprises forming a protective layer on the image forming layer by coating after or simultaneously with formation of the image forming layer.

4. The method of claim 3, wherein the protective layer exhibits a scratch hardness of 40 to 100 g, when subjected to a scratch test by the use of a 0.05 mm diameter sapphire needle.

5. The method of claim 1, wherein the image forming layer is an outermost layer.

6. The method of claim 1, wherein the image forming material is further subjected to a thermosetting treatment after forming the image forming layer or after forming the protective layer.

7. The method of claim 1, wherein the image forming layer exhibits a scratch hardness of 40 to 100 g, when subjected to a scratch test by the use of a 0.05 mm diameter sapphire needle.

8. The method of claim 1, wherein bond between the image forming layer and the support is weakened upon exposure, making at least a part of an exposed area of the image forming layer removable.

9. The method of claim 8, wherein the image forming material further has a peeling layer, the peeling layer being peeled after exposure to remove at least a part of an exposed area of the image forming layer.

10. The method of claim 1, wherein the support is a transparent support.

* * * * *